United States Patent

Yamamoto et al.

Patent Number: 5,811,867
Date of Patent: Sep. 22, 1998

[54] PHOTO DETECTIVE UNIT AND ELECTRIC APPARATUS USING THE SAME

[75] Inventors: Yosuke Yamamoto; Tadayoshi Ogawa; Shinji Yano, all of Kyoto, Japan

[73] Assignee: Rohm Co., Ltd., Kyoto, Japan

[21] Appl. No.: 709,725

[22] Filed: Sep. 9, 1996

[30] Foreign Application Priority Data

Sep. 12, 1995 [JP] Japan .................................. 7-234372

[51] Int. Cl.⁶ ...................... H01L 31/075; H01L 31/105
[52] U.S. Cl. ............................................. 257/458; 257/463
[58] Field of Search ..................................... 257/458, 463

[56] References Cited

U.S. PATENT DOCUMENTS

| | | |
|---|---|---|
| 4,847,210 | 7/1989 | Hwang et al. ........................... 257/458 |
| 5,291,054 | 3/1994 | Tanaka et al. ........................... 257/458 |
| 5,598,022 | 1/1997 | Kyomasu ................................. 257/458 |

OTHER PUBLICATIONS

Yamamoto et al *IEEE Transactions on Elec. Dev.* vol. 42 No. 1 Jan. 1995.

Primary Examiner—Jerome Jackson
Attorney, Agent, or Firm—Nikaido, Marmelstein, Murray & Oram LLP

[57] ABSTRACT

A photo detective unit includes a photo detective semiconductor chip including a photo detective element formed under a first manufacturing condition and a buffer circuit for shaping output waveform of the photo detective element, and a signal processing semiconductor chip formed under a second manufacturing condition and responsive to voltage from the photo detective semiconductor chip for generating digital data, and the photo detective semiconductor chip and the signal processing semiconductor chip are together accommodated in a single package.

4 Claims, 3 Drawing Sheets

PHOTO DETECTIVE UNIT AND ELECTRIC APPARATUS USING THE SAME

BACKGROUND OF THE INVENTION

1. Field of the Invention

The present invention relates to a photo detective unit and an electric apparatus using the same. More particularly, the present invention relates to a photo detective unit used for data transmission with light and an electric apparatus such as a remote controller using the photo detective unit.

2. Description of the Background Art

In the case of electric apparatuses including video apparatuses such as televisions and VTRs (Video Tape Recorders) and audio apparatuses such as stereos, which are provided with remote controllers, operation of each electric apparatus can be controlled even from a distance by operation of the remote controller. Data transmission of the remote controller is generally carried out with radiowaves or infrared rays. For domestic use, a remote controller with infrared rays having a shorter signal reachable distance but having less interference and also being cheaper is often used.

FIG. 5 is a block diagram showing a photo detective unit provided within a conventional remote controller. In FIG. 5, photo detective unit 4 includes a photodiode 41 and a signal processing IC (Integrated Circuit) 42, both of which are accommodated in a metal case 45. Photodiode 41 is an element through which current flows according to a light quantity of infrared rays L, and this current is applied through an interconnection 44 to signal processing IC 42. Signal processing IC 42 converts current flowing in photodiode 41 into voltage, carries out waveform shaping for removing an infrared ray carrier signal contained in the voltage signal, and demodulates a digital data signal transmitted from the remote controller for transmission to a control circuit of each electric apparatus.

However, a photodiode for use in such a photo detective unit generally has such a property that photocurrent may change only by about several $\mu A$ per 100 lux light, and therefore, the output impedance thereof will be increased. Accordingly, since the impedance of interconnection 44 for connecting photodiode 41 with signal processing IC 42 in photo detective unit 4 shown in FIG. 5 is increased and interconnection 44 is long with a length of at least several mm, an error signal resulting from noise from the outside of photo detective unit 4 is likely to be generated in interconnection 44, and a wrong data signal is transmitted to each electric apparatus, so that the electric apparatus might carry out operation different from that designated by the remote controller.

In order to prevent this, the whole photo detective unit is generally shielded with metal case 45 from noise, but in this case, the size of metal case 45 will be increased. If photo detective unit 4 is large in size, reduction in size of each electric apparatus provided with the photo detective unit is prevented, so that an external shape (design) of each electric apparatus may be restrained. Furthermore, purchase of the metal case and maintenance cost thereof are additionally required.

On the other hand, photo detective unit 4 could be formed with a one-chip semiconductor device, and in that case, only a short interconnection between photodiode 41 and signal processing IC 42 such as that having a length of several tens or several hundreds of $\mu m$ is required, and therefore, the photo detective unit is less likely to be subjected to external noise, whereby shielding of the whole photo detective unit with metal case 45 will not be necessary. However, in order to provide a semiconductor device having as small chip size as possible at low cost, a signal processing circuit and a photodiode are simultaneously formed with manufacturing conditions (processes) for formation of the signal processing circuit, resulting in difficulty in sufficient increase in the infrared ray detecting capability (photosensitivity) of the photodiode.

SUMMARY OF THE INVENTION

It is a primary object of the present invention to provide a photo detective unit requiring no shielding with a metal case, achieving reduction in size and having superior sensitivity, and an electric apparatus using the same.

To put the present invention briefly, a photo detective unit accommodated in a single package and responsive to light for processing data includes a photo detective semiconductor chip formed under a first manufacturing condition and including a photo detective element formed under the first manufacturing condition and a buffer circuit for shaping output voltage waveform of the photo detective element; and a signal processing semiconductor chip formed under a second manufacturing condition and responsive to output voltage from the photo detective semiconductor chip for generating digital data.

Therefore, according to the present invention, the photo detective unit can receive an optical data signal with sufficient sensitivity at the photo detective element and is less likely to generate an error signal resulting from external noise, so that the reachable distance of a remote control signal can be increased. Furthermore, the size of the photo detective unit can be reduced and the chip size of the signal processing semiconductor chip will not be increased, and therefore, the number of chips per wafer is increased, so that the signal processing semiconductor chip and the photo detective unit using the same can be manufactured at low cost.

In a preferred embodiment, the photo detective semiconductor chip is formed with a semiconductor substrate having such impurity concentration that improvement in photo detective sensitivity of the photo detective element is given priority, and the signal processing semiconductor chip is formed with a semiconductor substrate having such impurity concentration that improvement in integration degree is given priority, which is higher than that of the first manufacturing condition.

In a further preferred embodiment, the photo detective element includes a photodiode and a resistance for converting current flowing in the photodiode into voltage, and the buffer circuit includes an amplification circuit for amplifying voltage resulting from conversion by the resistance, and a transistor connected to an output of the amplification circuit.

In a still further preferred embodiment, the photo detective unit is used as a photo detective unit for a remote controller using infrared rays.

According to another aspect of the present invention, an electric apparatus using a photo detective unit is provided, wherein the photo detective unit is accommodated in a single package and is constituted by a photo detective semiconductor chip including a photo detective element formed on a first manufacturing condition and a buffer circuit for shaping output voltage waveform of the photo detective element, and a signal processing semiconductor chip formed on a second manufacturing condition and responsive to output voltage from the photo detective semiconductor chip for generating digital data.

Therefore, according to the above mentioned another aspect of the present invention, reduction in size of the photo detective unit can be achieved, and restriction on an external shape of the electric apparatus is reduced, so that the electric apparatus can be designed arbitrarily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
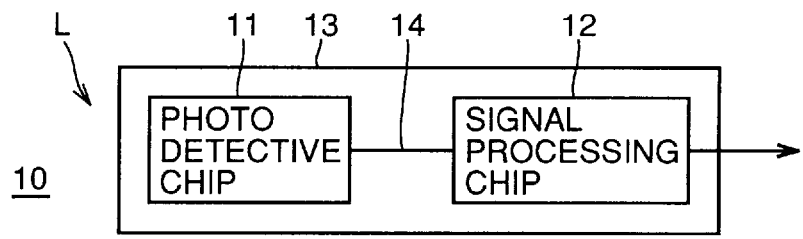
FIG. 1 is a block diagram showing one embodiment of the present invention.

FIG. 1 is a block diagram showing one embodiment of the present invention. In FIG. 1, a photo detective unit 10 includes a photo detective semiconductor chip 11 and a signal processing semiconductor chip 12, and these semiconductor chips are encapsulated in a package 13 of resin, ceramic or the like by a multi-chip technique. Photo detective semiconductor chip 11 includes a photodiode through which current flows according to a light intensity of infrared rays L, and a buffer circuit for amplifying a voltage signal obtained by conversion of the current into voltage and outputting the amplified signal with low impedance. Signal processing semiconductor chip 12 carries out waveform shaping in which an infrared ray carrier signal contained in the voltage signal is removed, demodulates a digital data signal transmitted from a remote control transmitter, and transmits the demodulated signal to a control circuit of each electric apparatus.

The photo detective unit is structured as such, whereby an error signal resulting from external noise will not be introduced into an interconnection 14 of a wire between photo detective semiconductor chip 11 and signal processing semiconductor chip 12, though interconnection 14 is several mm in length, achieving transmission of a reliable data signal to the control circuit of each electric apparatus.

Note that photo detective semiconductor chip 11 is formed under a first manufacturing condition, which will be described later, that improvement in photo detective sensitivity of the photodiode is given priority, and signal processing semiconductor chip 12 is formed under a second manufacturing condition that improvement in integration degree is given priority. Furthermore, a top surface of photo detective semiconductor chip 11 in package 13 is covered with resin which transmits infrared rays. In addition, signal processing semiconductor chip 12 may be structured so as not only to demodulate a signal but also to output a signal which has been decoded according to control of each electric apparatus after demodulation.

Figure 2:
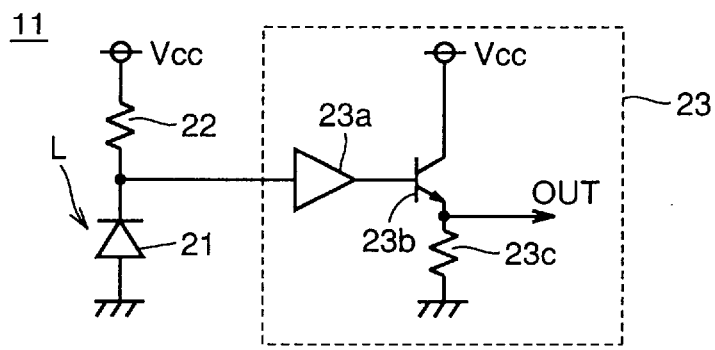
FIG. 2 is specific electric circuit diagram showing a photo detective semiconductor chip shown in FIG. 1.

FIG. 2 is a specific electric circuit diagram showing the photo detective semiconductor chip shown in FIG. 1. In FIG. 2, a resistance 22 and a photodiode 21 are connected in series between a power supply potential (Vcc) and a reference potential (GND), and the connection point between resistance 22 and photodiode 21 is connected to an input portion of a waveform shaping circuit 23. Photodiode 21 is in a reverse bias state, and applies current according to a light intensity of infrared rays to resistance 22. Resistance 22 converts current flowing in photodiode 21 into voltage. Waveform shaping circuit 23 shapes voltage waveform generated at resistance 22.

Waveform shaping circuit 23 is constituted by an amplification circuit 23a for amplifying voltage generated by photodiode 21 and resistance 22, a transistor 23b for transmitting a signal to the signal processing semiconductor chip with low impedance, and a driver circuit comprised of a resistance 23c. An output of amplification circuit 23a is connected to the base of transistor 23b, the collector thereof is connected to the power supply potential, the emitter thereof is connected to the reference potential through resistance 23c, and the connection point (OUT) between transistor 23b and resistance 23c is connected to signal processing semiconductor chip 12.

Figure 3:
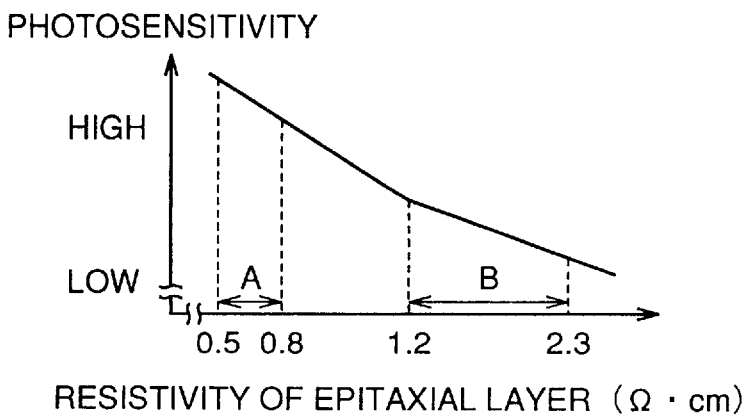
FIG. 3 is diagram showing the relationship between manufacturing condition and photosensitivity of the present invention.

FIG. 3 shows the relationship between the impurity concentration (hereinafter referred to as resistivity of epitaxial layer) of a substrate (wafer) of a semiconductor chip, which is a primary manufacturing condition that determines an electric property of each semiconductor chip, and the photoelectric current change rate (hereinafter referred to as photo detective sensitivity) of photodiode 21 with infrared rays. In FIG. 3, for formation of a photodiode having high photo detective sensitivity, a photo detective semiconductor chip is manufactured under the first manufacturing condition that a wafer having low resistivity of epitaxial layer shown as a range A is used, and for formation of a semiconductor chip with high packing degree and small size, a signal processing semiconductor chip is manufactured under the second manufacturing condition that a wafer having higher resistivity of epitaxial layer than that of the first manufacturing condition shown as a range B is used. The resistivity of epitaxial layer for use may be in the range from 0.5 to 0.8 $\Omega$.cm for the range A, and in the range from 1.2 to 2.3 $\Omega$.cm for the range B, for example.

Figures 4A, 4B:
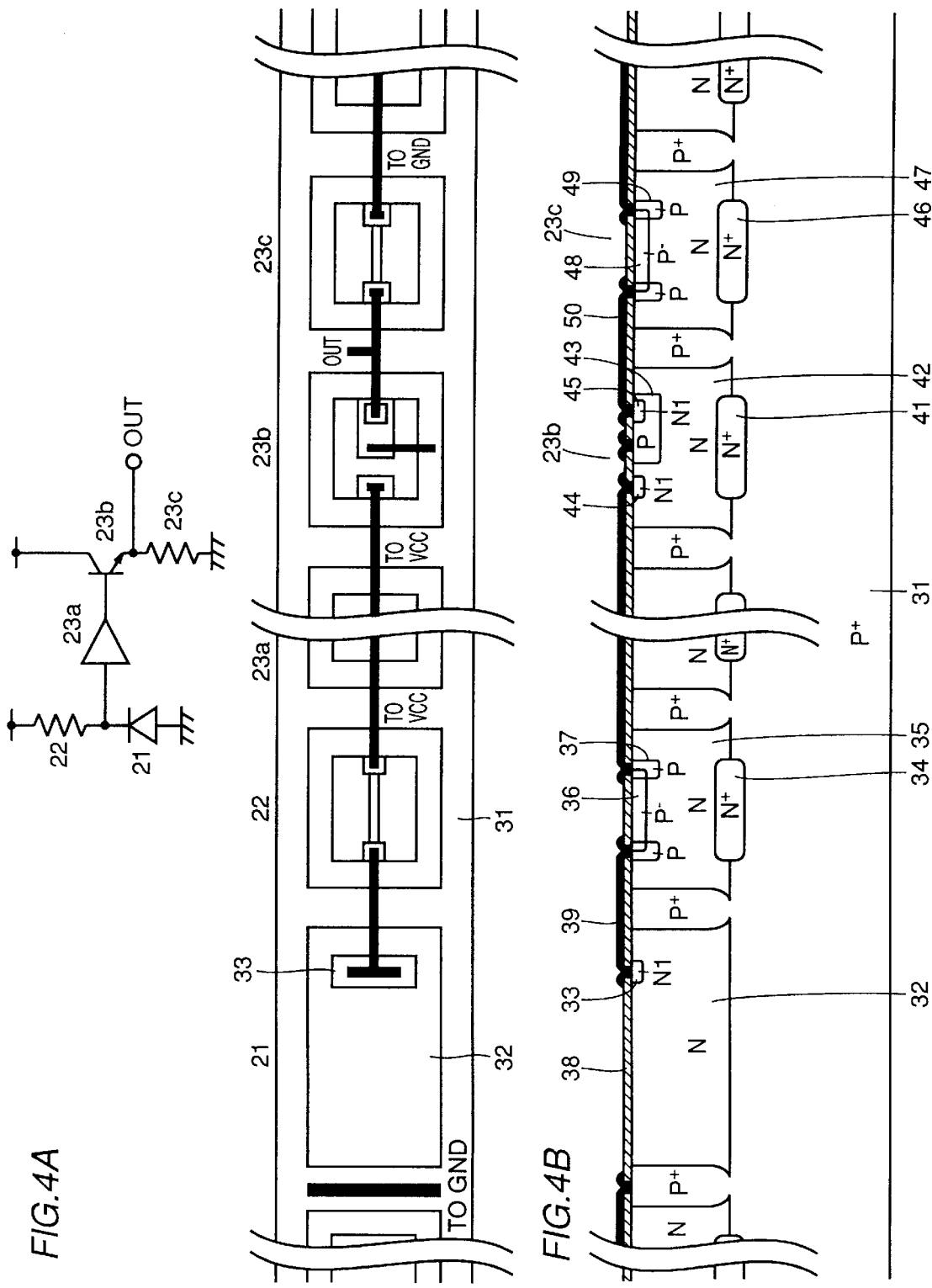
FIGS. 4A and 4B are plan and cross sectional views showing the photo detective semiconductor chip shown in FIG. 2, respectively.
Figure 5:
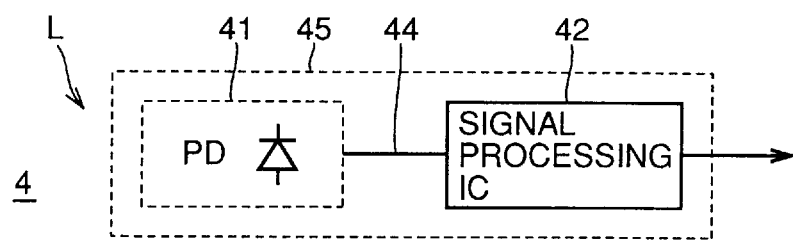
FIG. 5 is a block diagram showing a photo detective unit provided within a conventional remote controller.

FIG. 4A is a plan view of the photo detective semiconductor chip shown in FIG. 2, and FIG. 4B is a cross sectional view thereof.

An N type growth layer 32 separated by P type separation diffusion is formed on a P type silicon substrate 31 having resistivity in the range A of FIG. 3, and an N type thermal diffusion layer 33 is further formed by thermal diffusion, whereby photodiode 21 shown in FIG. 2 is formed. An N type buried layer 34 is formed adjacent to photodiode 21, an N type growth layer 35 is formed thereon, and P type thermal diffusion layers 36 and 37 are further formed at a surface of N type growth layer 35, whereby resistance 22 is formed. A silicon oxide film 38 is formed over photodiode 21 and resistance 22, and an electric interconnection 39 for connecting photodiode 21 with resistance 22 is formed on silicon oxide film 38 using aluminum or the like.

Amplifier 23a is not shown in FIGS. 4A and 4B. An N type growth layer 42 as a collector is formed on an N type buried layer 41, a P type thermal diffusion layer 43 as a base is formed at a surface of N type growth layer 42, and an N type thermal diffusion layer 44 is further formed at the surface of N type growth layer 42, and an N type thermal diffusion layer 45 as an emitter is formed at a surface of P type thermal diffusion layer 43, whereby output transistor 23b is formed. Resistance 23c is formed in a manner similar to that of resistance 22, and includes an N type buried layer 46, an N type growth layer 47 and P type thermal diffusion layers 48 and 49. Furthermore, transistor 23b and resistance 23c are connected with each other by an electric interconnection 50 formed on silicon oxide film 38.

On the other hand, signal processing semiconductor chip 12 has a circuit which is formed by a manufacturing method similar to that of the photo detective semiconductor chip described above, wherein a silicon substrate having resistivity in the range B of FIG. 3 is used, so that finer processing can be carried out.

As described above, the photo detective and signal processing semiconductor chips are each formed by the bipolar semiconductor device formation steps which are similar to those in a conventional example, using wafers each having different resistivity of epitaxial layer and on process conditions according to the resistivity of epitaxial layer, and those semiconductor chips are packaged, whereby the photo detective unit of the present invention can be completed.

Note that the present invention is not limited to the above mentioned embodiment, resistance 22 of FIG. 2 may be constituted by dynamic resistance of a transistor and a phototransistor may be used instead of the photodiode, and further, the driver circuit only needs to have a circuit structure of low output impedance. Furthermore, the semiconductor chip structure as in the present invention may be formed under the manufacturing condition other than the resistivity of epitaxial layer, such as impurity concentration of a diffusion region in an element, design rule or the like.

As described above, according to the present embodiment, the photo detective unit can receive an optical data signal with sufficient sensitivity at the photodiode, and is less likely to generate an error signal resulting from external noise, so that the reachable distance of a remote control signal can be increased, resulting in reduction in size of the photo detective unit. Furthermore, the size of the signal processing semiconductor chip will not be increased, and the number of chips per wafer is therefore increased, so that the signal processing semiconductor chip and the photo detective unit using the same can be manufactured at low cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photo detective unit comprising:
   a plurality of semiconductor chips accommodated in a single package and responsive to light for processing data, wherein
   said plurality of semiconductor chips includes
   a photo detective semiconductor chip formed on a semiconductor substrate having an impurity concentration, said photo detective semiconductor chip including a photo detective element and a buffer circuit shaping an output voltage waveform of said photo detective element, and
   a signal processing semiconductor chip formed on a semiconductor substrate having a second impurity concentration which is higher than said first impurity concentration, said signal processing semiconductor chip responsive to the output voltage from said photo detective semiconductor chip for generating digital data, wherein the second impurity concentration is at least twice that of the first impurity concentration.

2. The photo detective unit as recited in claim 1, wherein
   said photo detective element includes a photodiode and a resistance for converting current flowing in the photodiode into voltage, and
   said buffer circuit includes an amplification circuit for amplifying the voltage resulting from the conversion by said resistance, and a transistor connected to an output of the amplification circuit.

3. The photo detective unit as recited in claim 1, wherein
   said photo detective unit is one provided in a remote controller using infrared rays.

4. An electric apparatus comprising:
   a photo detective unit of an infrared remote control system, wherein
   said photo detective unit has a plurality of semiconductor chips accommodated in a single package, said plurality of semiconductor chips including
   a photo detective semiconductor chip including a photo detective element and a buffer circuit forming an output voltage waveform of said photo detective element, said photo detective semiconductor chip formed on a substrate having a first impurity concentration: and
   a signal processing semiconductor chip responsive to the output voltage from said photo detective semiconductor chip for generating digital data, said signal processing semiconductor chip formed a substrate having a second impurity concentration which is at least twice that of said first impurity concentration.

* * * * *